United States Patent [19]

Leroux et al.

[11] Patent Number: 5,350,428

[45] Date of Patent: Sep. 27, 1994

[54] ELECTROSTATIC APPARATUS AND METHOD FOR REMOVING PARTICLES FROM SEMICONDUCTOR WAFERS

[75] Inventors: Pierre Leroux; Bryan D. Schmidt, both of San Antonio, Tex.

[73] Assignee: VLSI Technology, Inc., San Jose, Calif.

[21] Appl. No.: 80,165

[22] Filed: Jun. 17, 1993

[51] Int. Cl.⁵ .......................................... H01L 21/30
[52] U.S. Cl. ................... 29/25.01; 437/210; 437/925; 15/1.51
[58] Field of Search ............... 437/210, 925; 29/25.01; 15/1.51

[56] References Cited

U.S. PATENT DOCUMENTS

| | | | |
|---|---|---|---|
| 2,920,987 | 1/1960 | Landry et al. | 134/1 |
| 3,668,008 | 6/1972 | Sevfurynse | 134/1 |
| 3,939,526 | 2/1976 | Mania et al. | 15/306 B |
| 4,268,934 | 5/1981 | Testone | 15/306 B |
| 4,483,611 | 11/1984 | Matsuura et al. | 355/15 |
| 4,677,704 | 7/1987 | Huggins | 15/1.5 R |
| 4,744,833 | 5/1988 | Cooper et al. | 15/1.5 R |
| 4,777,804 | 10/1988 | Bowling et al. | 62/85 |
| 4,785,324 | 11/1988 | Yamazaki et al. | 355/3 R |
| 4,839,206 | 6/1989 | Waldenberger | 428/40 |
| 4,864,461 | 9/1989 | Kasahara | 361/234 |
| 4,987,286 | 1/1991 | Allen | 219/121.68 |

FOREIGN PATENT DOCUMENTS

| | | | |
|---|---|---|---|
| 58-21352 | 2/1983 | Japan | 29/25.01 |
| 58-60551 | 4/1983 | Japan | 29/25.01 |
| 59-67629 | 4/1984 | Japan | 29/25.01 |
| 62-205616 | 9/1987 | Japan | 437/925 |
| 63-308320 | 12/1988 | Japan | 15/1.51 |

OTHER PUBLICATIONS

"IBM TDB" vol. 18, No. 5, Oct. 1975, K. S. Sachar.

*Primary Examiner*—Olik Chaudhuri
*Assistant Examiner*—David E. Graybill
*Attorney, Agent, or Firm*—Burns, Doane, Swecker & Mathis

[57] ABSTRACT

Disclosed herein is an apparatus and method for cleaning the edges of semiconductor wafers by using a particle removing means having an electrostatically charged material. The particles are collected and disposed of so that they do not come in contact again with the clean semiconductor wafers.

33 Claims, 4 Drawing Sheets

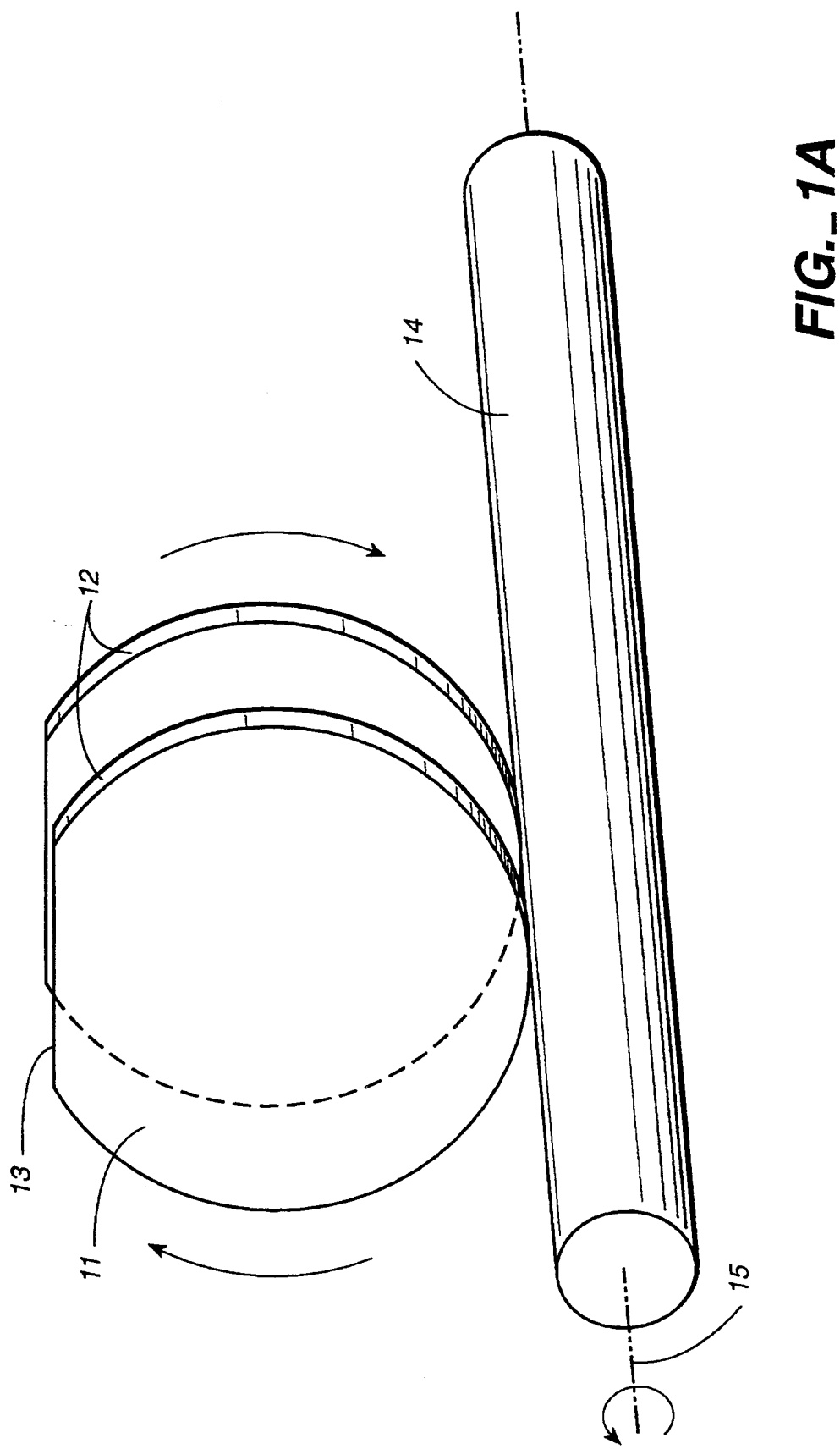
FIG._1A

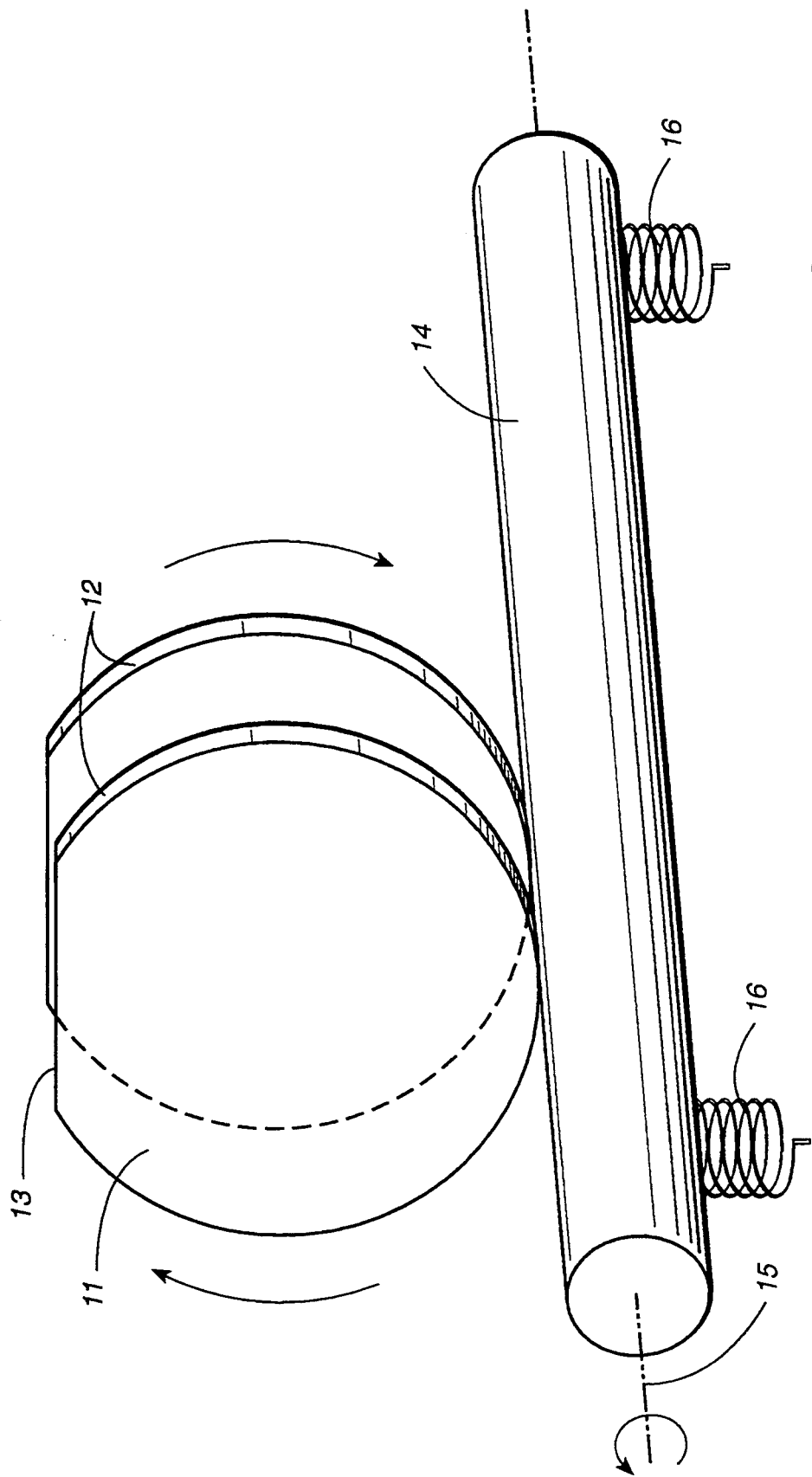
FIG._1B

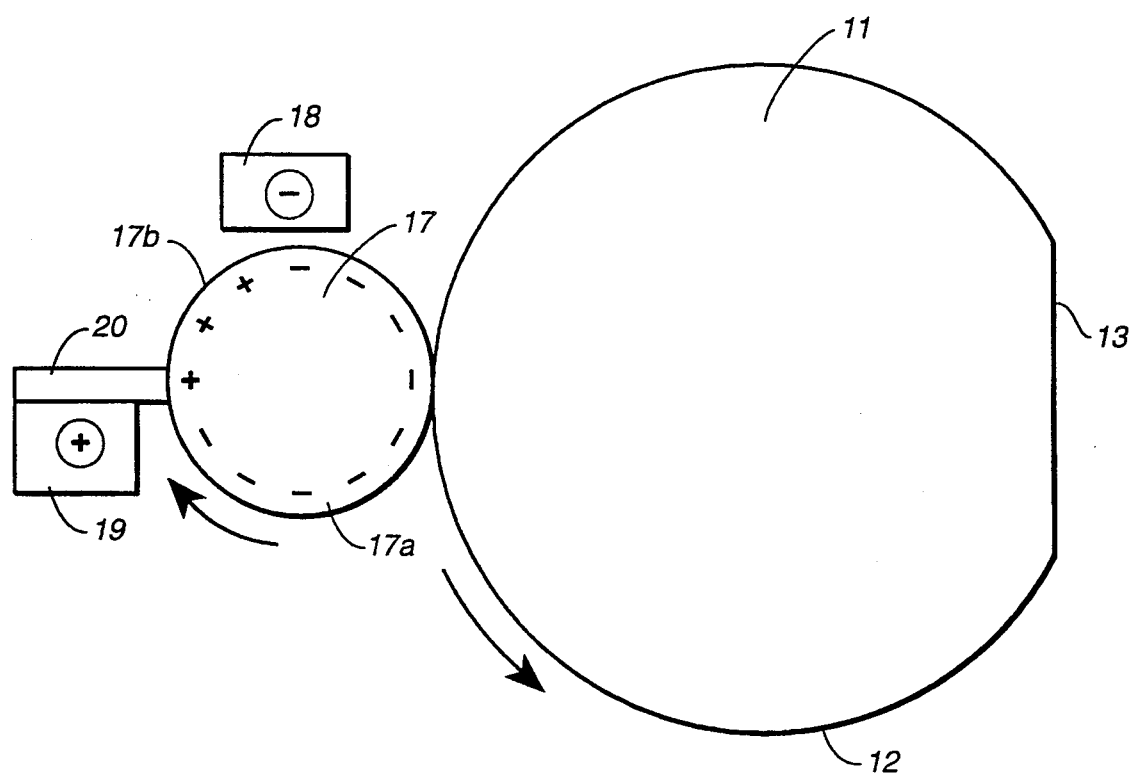
FIG._2

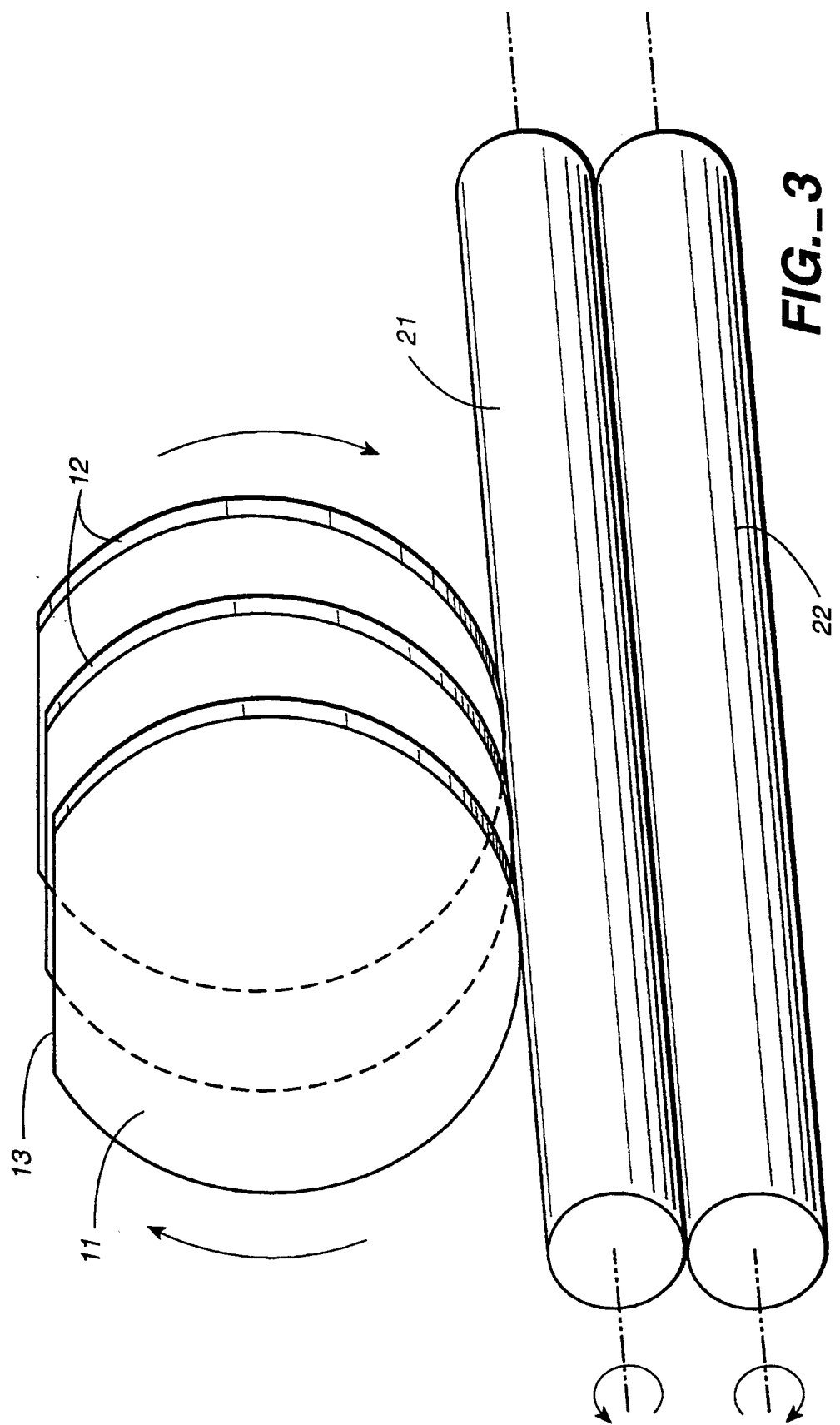

ELECTROSTATIC APPARATUS AND METHOD FOR REMOVING PARTICLES FROM SEMICONDUCTOR WAFERS

BACKGROUND OF THE INVENTION

1. Field of the Invention

This invention relates to an apparatus and method for removing particles from the edges of semiconductor wafers in a manner that inhibits the return of such particles to the edges of the wafers. In particular, in one aspect, this invention relates to a method for removing particles from the edges of semiconductor wafers and retaining the particles away from the semiconductor wafers with an electrostatically charged material that causes a substantially unidirectional flow of particles away from the edges of the semiconductor wafers. In another aspect, this invention relates to an apparatus which electrostatically withdraws particles from the edges of semiconductor wafers in a manner that inhibits the return of such particles to the edges of the wafers.

2. State of the Art

In the electronics industry, particle contamination is an important factor in the manufacture of high density integrated circuits from semiconductor wafers. Even in relatively conventional technology using micron or larger circuit patterns, submicron size particle contamination can be a problem. Today the technology is progressing into the submicron pattern size, and particle contamination is even more of a problem. Contaminant particles larger than roughly 10% of the pattern size can create damage such as pinholes which interfere with fabrication processes (such as etching, deposition and the like) and defects of that size are a sufficiently significant proportion of the overall pattern size to result in rejected devices and reduced yield. As an example, it has been found that the minimum particle size which must be removed in order to achieve adequate yield in one Megabit chip (which has a pattern size of one micron) is about 0.1 microns.

Filtration (of air and liquid), particle detection, and contaminant removal are techniques which are used in current contamination control technology in order to address the problems outlined above. For example, semiconductor fabrication is often conducted in clean rooms in which the air is highly filtered, the rooms are positively pressurized, and the personnel allowed into the room are decontaminated and specially garbed before entry is allowed.

Another previously developed method of particle removal is to place the surface to be cleaned in a chemical bath and then use an ultrasonic or a megasonic sound agitating system. In this system, the ultrasonic or megasonic sound is induced into the liquid which shakes the chemical bath and attempts to remove any particles. This has been somewhat effective against relatively large particles, but ineffective against small particles.

Another cleaning method which has been previously used is to blast the surface to be cleaned with a fluid in order to blow or wash the particles from the surface. One such method utilizing water is disclosed in U.S. Pat. No. 4,027,686, to Shortes, et al. and assigned to Texas Instruments, Inc. Other fluids, including air, have been used with varying degrees of success. These methods have proven to be effective against large particles, but relatively ineffective against particles in the 0.1 micron or smaller range.

Another previously developed method involving application of force to the particle exploits the mass of the particle by the use of gravity or centrifugal force. This method requires the particle to be of sufficient size to be pulled or thrown from the surface. When the particles are very small or have little mass, the forces may not be high enough to remove them. Therefore, this method is generally ineffective against submicron sized particles.

Still another line of previous attempts to remove particles is to convert them into nonparticles. This requires a knowledge of the chemistry of the particles, or a universal solvent (one that would dissolve all particles). This method uses a chemical specifically designed to attack and dissolve the particles but not the substrate they are on. It is necessary to know what the particles to be removed are and, therefore, the appropriate chemical. Since it is unlikely that the composition of all the particles will be known, it is difficult to remove all the particles with a chemical.

Another prior method to remove particles involves particle and surface interaction. This is an attempt to make the particle and the surface repel each other through the use of electricity. The problem encountered with this method is that a high electrical charge is required and, thus, it has been found to be undesirable.

One of the most common methods of particle removal involves using a brush scrubber. In this method, a brush is used to wipe the particles from the surface. It is necessary to compromise the stiffness of the brush bristles so that they are stiff enough to remove the particles yet soft enough to not damage the surface. This method is effective against relatively large particles only and is relatively ineffective on the edges of the wafers.

A final method of removing particles has been an attempt to adhere the particles to a removable film. A polymer gel or liquid is applied to the surface in an attempt to soak up all the particles. After the polymer has dried, and hopefully drawn the particles into it, the polymer is peeled off to remove the particles. This method, as with the other methods listed above, works only with relatively large particles and doesn't address the problem of particles situated at the edges of the wafers.

As the particle size decreases the particle weight become less significant as compared to other adhesive forces binding the particle to the surface which it contaminates. Removal of such small particles can potentially damage the substrate. In general, it has been found that submicron particles are the most difficult to remove. Many of the processes developed to clean integrated circuits, such as ultrasonic agitation, are not effective for micron and submicron particles and indeed, sometimes add contaminants to the substrate.

As alluded to above, another handicap of these previously developed physical removal processes is the fact that they can damage the surface being cleaned as well as introduce other particles while trying to remove them.

Additionally, prior art methods of removing particles from semiconductor wafers have focused almost exclusively on the removal of particles from the front and back surfaces of the wafers. However, by leaving particles on the sides or edges of the semiconductor wafers, it is possible for these particles to migrate to the front or back surface of the wafer by, e.g., physical, mechanical, electrostatic or other such means, and there interfere with the processing of the wafer.

Accordingly, there is a great need for a removal technique which allows for the removal of particles from the edges of semiconductor wafers. Such a removal technique should also provide a driving force sufficient to effectively remove particles from the edges of semiconductor wafers without any substantial harm to the substrate material. Moreover, an acceptable removal technique should provide a minimum level of cleanliness in a reliable fashion.

SUMMARY OF THE INVENTION

In one aspect of this invention, there is provided an apparatus for removing particles from the edges of semiconductor wafers. The apparatus comprises a particle removing means contactable with the edge of at least one semiconductor wafer which removes particles from the edges of such wafer(s) and inhibits the return of the particles to the semiconductor wafer(s). The surface of the particle removing means preferably comprises an electrostatically charged material. The particle removing means is preferably contained in a suitable housing.

In another aspect of this invention, there is provided an apparatus which comprises a particle removing means contactable with the edge of at least one semiconductor wafer and a particle dislodging means. The particle removing means preferably comprises an electrostatically charged material which removes particles from the edges of the semiconductor wafers and the particle dislodging means removes the particles from the particle removing means and inhibits the return of the particles to the particle removing means and/or the semiconductor wafer(s). The particle dislodging means preferably comprises a brush and/or an electrostatically charging means to change the electrical charge on the surface of the particle removing means. The particle removing means and the particle dislodging means are preferably contained in a suitable housing.

In another aspect of this invention, there is also provided a method for removing particles from the edges of semiconductor wafers. The method comprises contacting the edge of at least one semiconductor wafer with a particle removing means to remove particles therefrom wherein the surface of the particle removing means comprises an electrostatically charged material that removes the particles from the semiconductor wafers in a manner that inhibits the return of the particles to the edges of the wafers.

In yet another aspect of this invention, there is provided a method for removing particles from the edges of semiconductor wafers. The method comprises contacting the edge of at least one semiconductor wafer with a particle removing means to remove particles therefrom wherein the surface of the particle removing means comprises an electrostatically charged material that removes the particles from the semiconductor wafers in a manner that inhibits the return of the particles to the edges of the wafers; and contacting said particle removing means with a particle dislodging means so as to dislodge at least a portion of the particles from said particle removing means.

BRIEF DESCRIPTION OF THE DRAWINGS

FIGS. 1A, 1B, 2 and 3 depict various portions of preferred apparatus of this invention.

DETAILED DESCRIPTION OF THE PREFERRED EMBODIMENTS

As depicted in FIG. 1A, there is shown a portion of a preferred apparatus for removing particles from the edges of semiconductor wafers according to the present invention. In particular, there is depicted in FIG. 1A a flat align spindle 14 which constitutes the particle removing means for one embodiment of this invention. At various portions during the processing of the wafers, a flat align spindle such as depicted in FIG. 1A is made to contact the semiconductor wafers 11 which have an edge 12 and a flattened portion 13 so as to orient the wafers into a predetermined orientation.

During the processing of semiconductor wafers, the edges 12 of the wafers 11 get dirty, i.e., the edges accumulate undesirable particles of various sizes and compositions. However, standard cleaning techniques are designed to clean the front and back surfaces of the wafer and do very little to clean the edges of the wafer. Apparently, this accumulation of particles on the edges of the wafer has not been recognized as being sufficiently problematic to warrant a separate cleaning step. However, the present inventors have learned that the particles remaining on the edges of the wafers after cleaning can migrate to the front or back surface of the wafer where they interfere substantially with the processing of the wafer.

For example, if the particles migrate to the front surface of the wafer prior to or during the photoprocessing of the wafer, they can create shadows on the photoresist which distort the pattern of the etch. Similarly, if the particles migrate to the back surface of the wafer prior to or during the photoprocessing of the wafer, they can raise a portion of the wafer thus causing the photoresist on the top surface of this portion of the wafer to be out of focus. Consequently, the pattern of the etch is again distorted.

As the features of very large scale integration (VLSI) circuits continue to shrink to 1 $\mu$m or less, there is an ever increasing need to clean not only the front and back surfaces of the semiconductor wafer, but also to clean the edges of the wafers so as to avoid the problems identified above. By cleaning the edges of the semiconductor wafers, the apparatus and method of the present invention significantly reduces the problems associated with contamination of semiconductor wafers by particle migration from the edges of the wafers to the front or back surface of the wafers.

As used herein, the term "edge" or "edges" of a semiconductor wafer refer to not only the exterior circumference of the wafer but also that portion of the front and back surface of the wafer proximate the exterior circumference from which particles are also withdrawn during the practice of the invention.

It is known in the art to use flat align spindles in order to align the wafers into a predetermined orientation. The exterior surface of these flat align spindles have been made of materials such as polytetrafluoroethylene ("Teflon" TM) and provide a small measure of cleaning on the edges of the semiconductor wafers. However, the use of these "Teflon" TM-coated spindles have a number of serious limitations. First, the particle retaining capacity of these spindles is very limited. Thus, after a relatively short period of time, the spindles became covered with particles such that the spindles essentially lose their ability to remove particles from the edges of the wafers. Moreover, the force holding the particles to the spindles is so slight that the particles tend to return again to the edge of the same or a different semiconductor wafer. Additionally, if these spindles are to be effective in cleaning the semiconductor wafers, it is necessary to clean or replace these spindles on a frequent basis. However, due to the inconvenience of such cleaning processes and the cost of replacing these spindles, neither of the above tended to be done with the degree of frequency that a successful cleaning operation demanded. Thus, there is a significant need for an in-line cleaning process which reliably and efficiently cleans the edges of semiconductor wafers.

Consequently, the present invention seeks to remove the particles from the edges of semiconductor wafers by contacting the wafer edges with a particle removing means which withdraws the particles from such edges and retains or disposes of the particles such that they are not returned to the edges of the wafers. For this reason, the particle removing means has a particle attracting force which is greater than the force holding the particles to the edges of the semiconductor wafers. In other words, the particle attracting force of the particle removing means is sufficient to remove the particles from the edges of the wafers and to inhibit the return of such particles to the wafers.

The present inventors have also learned that a portion of these particles carry net negative or positive charges. Accordingly, while it is possible that the attracting force of the particle removing means may be mechanical, physical, chemical, magnetic or electrostatic in nature, it is preferred that the particle removing means employ the removing force of an electrostatically charged material which is opposite the charge of the particles to be removed. Alternatively, the particle removing means may be made of a material which is capable of using a magnetic charge to remove particles from the edges of the semiconductor wafers. Additionally, the invention contemplates a combination of removing means, e.g., an electrostatically charged material covering a magnetic-charge containing material.

According to a preferred embodiment of the invention, the particle removing means is essentially cylindrical in shape, e.g., the shape of a roller, cylinder, tube or spindle, and is rotatably contacted with the edge of the semiconductor wafer. For example, the particle removing means may comprise a flat align spindle 14 which is caused to roll around axis 15 in a pre-determined direction as indicated in FIG. 1A. And, by contacting the wafers, the flat align spindle 14 preferably causes the wafers to rotate until arriving at the flattened portion 13 of the wafer 11. Rotation of wafer 11 can be controlled to be in the same or opposite direction of that of spindle 14.

While the flat align spindle 14 is rotating the wafers 11, it is also simultaneously withdrawing particles from the edges 12 of the wafers 11. As a result of the electrostatically charged material on the surface of the flat align spindle 14, the particles withdrawn by the flat align spindle 14 remain attached to the surface thereof. That is, the flat align spindle 14 has a sufficient attracting force not only to remove the particles from the edges 12 of the wafers 11, but also to inhibit any substantial return transfer of particles from the particle removing means to the edges 12 of the wafers 11.

According to another preferred embodiment of the invention illustrated in FIG. 1B, the particle removing means is made to contact the edge of the semiconductor wafers, including the flat edge 13, by, for example, springs 16 which spring load the particle removing means against the wafers. By spring loading the particle removing means against the wafer, it is possible to control the amount of force applied by the particle withdrawing means against the wafers.

In another embodiment, the semiconductor wafers or the particle removing means, or both, are made to traverse laterally in relation to the other. In this way, it is possible to expose the edge of the wafers to a relatively clean portion of the particle removing means, i.e., a portions of the particle withdrawing means that are less saturated than other portions thereof. The purpose of this lateral displacement is to maximize the cleaning capacity of the particle removing means by effectively utilizing the entire surface of the particle removing means.

Although the particle removing means may be located and/or used at any position throughout the processing of the semiconductor wafers, it is preferably rotatably connected within a wafer boat. Thus, the wafer boat comprises a preferred housing for the particle removing means according to the invention. However, it will be appreciated that this preferred embodiment of this invention contemplates the use of any suitable housing.

This invention also provides a particle removing means which is contactable with the particle dislodging means which removes the particles from the particle removing means thereby inhibiting the return of the particles to the semiconductor wafers.

This invention still also provides a particle withdrawing means which is contactable with both the semiconductor wafer and the particle removing means. In a preferred embodiment illustrated in FIG. 3, the particle withdrawing means and particle removing means are essentially cylindrical in shape and are disposed in parallel with one another so as to be contactable over essentially the entire surface thereof. The particle withdrawing means 21 contacts the wafers and preferably causes the wafers to rotate until arriving at the flattened portion 13 of the wafer 11 wherein rotation of the wafers may be controlled to be either in the same direction or in the opposite direction of the particle withdrawing means 21.

According to a preferred embodiment of the invention, the particle withdrawing means is made to contact the edge of the semiconductor wafer, including the flat edge 13, by e.g., spring loading the particle withdrawing means against the wafers. By spring loading the particle withdrawing means, it is possible to control the amount of force applied by the particle withdrawing means against the wafers.

The particle withdrawing means 21 has a particle attraction force which is sufficient to withdraw the particles from the edge of the semiconductor wafer which it contacts. The attracting force of the particle withdrawing means may be, e.g., mechanical, physical, chemical, or electrostatic in nature. For example, the particle withdrawing means may be made of, e.g., "Teflon" TM (polytetrafluoroethylene) or "Tigon" TM (polyvinylchloride), both of which have particle attracting capabilities.

In FIG. 3, the particle removing means 22 comprises an electrostatically charged material which removes charged particles of opposite charge from the particle withdrawing means 21 thereby removing a portion of the particles from means 21 which effects a level of cleaning of means 21. In this regard, if particle withdrawing means 21 is electrostatically charged, then particle removing means 22 should have the same albeit larger charge to effect removal of charged particles from particle withdrawing means 21.

The term "electrostatically charged material" is intended to include any material which is capable of carrying an electrostatic charge sufficient to withdraw particles of the desired size and polarity from the semiconductor wafers. This is not to say that the material is not capable of containing another type of particle withdrawing capability, e.g., magnetic. Rather, it merely means that at least some of the particles are withdrawn or removed by an electrostatic charge.

In general, materials capable of being charged with an electrostatic charge are known in the art and the present invention contemplates the use of a wide range of materials capable of carrying a suitable electrostatic charge. Examples of materials which can be caused to carry a suitable electrostatic charge include amorphous silicon, polypropylene, polethylene, polyester, vinyl chloride, "Tetron" (tradename), "Teflon" (tradename), rayon, polyester, nylon, etc. Particularly preferred according to the present invention, however, is amorphous silicon.

The function of the electrostatically charged material is to provide instantaneous removal of the particles of opposite polarity from the edges of the wafers or from the particle withdrawing means. The strength and polarity of the charge employed by the particle removing means depends upon the type, size and polarity of the particles which are to be removed. For example, the strength of the charge usually increases as the size of the particles decreases.

It is possible according to the present invention to vary the charge on the particle removing means so as to remove particles having differing charges. It is also possible to vary the strength of the charge on the particle removing means so as to remove particles of differing sizes. The strength and polarity of the charge may be varied by altering the charge on the same particle removing means or by employing a second particle removing means which is charged to a different strength and/or polarity than the first particle removing means.

A preferred embodiment of the invention employing a single particle removing means is depicted in FIG. 2. In particular, a single particle removing means in the shape of a flat align spindle 17 containing an electrostatically charged material such as amorphous silicon is exposed to a charging means 18 so as to impart a charge, e.g., a negative charge 17a, to the flat align spindle 17. The charged particle removing means is rotatably contacted with the edge 12 of at least one semiconductor wafer 11. The charged particle removing means removes charged particles of opposite polarity and of the desired sizes from the edges 12 of the semiconductor wafers 11.

Once the particles have been removed by the particle removing means 17, it is preferable to eliminate the possibility of such particles coming in contact again with the semiconductor wafers 11. Accordingly, in this preferred aspect of the invention, the particles removed from the semiconductor wafers are dislodged from the particle removing means 17 by exposing the particle removing means 17 to an electrostatic dislodging means 19 which reverses the polarity or substantially eliminates the charge on the particle removing means 17b thereby causing the particle removing means 17 to shed the charged particles removed from the edges of semiconductor wafer(s) 11.

Alternatively, the dislodging means may also be a brush or scraper which physically contacts and thereby dislodges particles from the particle removing means 17.

Accordingly, the dislodging means used to remove particles from the particle removing means 17 may be a physical dislodging means which utilizes physical contact with the particle removing means 17 to effect particle removal or it may be an electrostatic dislodging means which reverses or neutralizes the polarity of the particle removing means 17 to effect particle removal.

In a particularly preferred embodiment and as shown in FIG. 2, the dislodging means comprises both a physical dislodging means 20 and an electrostatic discharge means 19. The physical dislodging means 20 is particularly useful for dislodging larger particles and particles which are not dislodged by the electrostatic dislodging means 19.

In accordance with one aspect of this invention, the physical dislodging means is comprised of a material which has a resistivity on the order of about $10^8$ ohm-cm or more, and thus is relatively insulating in nature. Materials having a resistivity on the order of about $10^8$ ohm-cm or more are well known in the art.

During the rotation of the particle removing means, a frictional force is developed between the physical dislodging means and the particle removing means due to the contact between the two. However, by employing an insulating material such as plastic or rubber as the physical dislodging means, there is essentially no variation in the charge on the surface of the particle removing means. Additionally, if the particle removing means is comprised of a material having a sufficient hardness, e.g., amorphous silicon with a Vickers' hardness upwards of about 1000, there is no risk of surface wear on the particle removing means.

The physical dislodging means may also be comprised of a material having a resistivity of greater or less than about $10^8$ ohm-cm. In this way, the physical dislodging means may be used to strengthen, reverse, or weaken the charge on the particle removing means. Materials having a resistivity of greater than or less than about $10^8$ ohm-cm are also well known in the art.

Furthermore, as illustrated in FIG. 2, by being in contact with the particle removing means, the physical dislodging means 20 also serves as an isolation means which shields the electrostatic dislodging means 19 from the charging means 18. If it is desired, the isolation means may also be coated with a material which is reflective to the light emitted by the charging means and/or the electrostatic dislodging means. For example, it is possible to coat a portion of the isolation means with a reflective metal such as aluminum. In fact, by coating a portion of the isolation means with a reflective material, it is possible to enhance the efficiency of the charging means and/or the electrostatic dislodging means.

In order to dispose of the particles that are discharged by the electrostatic dislodging means 19 and/or the physical dislodging means 20, the particles are collected by a particle collecting means (not depicted in the figures). The particle collecting means may be any type currently used in the art. For example, the particle collecting means according to the invention includes any type of apparatus used to eliminate contaminant particles from the air such as those used in clean rooms which employ pressure differentials, air filters, etc.

Another embodiment of the present invention comprises a method for removing particles from the edges of semiconductor wafers. In particular, the method comprises contacting the edge of at least one semiconductor wafer with the particle removing means of the present invention. By contacting the edges of the semiconductor wafer(s), the particle removing means extracts particles from the wafers and also inhibits the return of those particles to the wafer(s).

The preferred embodiments for the apparatus of the present invention also apply to the method of the present invention. For example, in a preferred embodiment of the method according to the invention, the particle removing means comprises an electrostatically charged material. The particle removing means having an electrostatically charged material is exposed to a charging means that imparts a charge having the appropriate polarity and sufficient strength to remove those particles which are desired to be removed from the edges of the semiconductor wafers.

It is also preferred that the particle removing means be essentially cylindrical in shape, e.g., a roller, cylinder, tube, spindle or the like. The cylindrical particle removing means is disposed in parallel with the semiconductor wafers so as to be contactable with the edges of the wafers.

For example, as depicted in FIG. 2, a particle removing means in the shape of a flat align spindle 17 made of an electrostatically charged material such as amorphous silicon is caused to carry a charge 17a at its surface by exposing it to a charging means 18. The charged particle removing means is rotatably contacted with the edge 12 of at least one semiconductor wafer 11.

Once the particles have been withdrawn by the particle removing means 17, it is preferable to eliminate the possibility of such particles coming in contact again with the semiconductor wafers 11. Accordingly, in another embodiment of the invention, the particles removed from the semiconductor wafers are discharged from the particle removing means 17 by exposing the particle removing means 17 to a suitable dislodging means or combination of suitable dislodging means such as physical dislodging means 20 and electrostatic dislodging means 19 which reverses the polarity or substantially eliminates the charge on the particle removing means 17b.

Additionally, the dislodging means discussed above can be employed in combination with the particle removing means 22 illustrated in FIG. 3 to provide a means to dislodge particles from the particle removing means 22.

In another embodiment of the invention, the particle removing means is caused to contact the semiconductor wafers after a photoresist has been applied to the wafers but prior to the photoprocessing of the photoresist material. The particle removal method of the present invention is especially useful at this point in the processing scheme because most cleaning techniques are severely limited at this stage, i.e., many cleaning techniques adversely affect the photoresist. For example, plasmas and acids cannot be used effectively at this stage of semiconductor processing because they tend to dissolve or destroy the photoresist material.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including the equivalents thereof.

What is claimed is:

1. An apparatus for removing particles from the edges of semiconductor wafers which comprises a particle removing means contactable with the edge of at least one semiconductor wafer which removes particles from said wafer(s) and which inhibits the return of said particles to said wafer(s), wherein said particle removing means comprises a non-metallic electrostatically charged material.

2. An apparatus according to claim 1, which further comprises a housing containing said particle removing means.

3. The apparatus according to claim 1, wherein said particle removing means is essentially cylindrical in shape and is rotatably contacted with the edge of said wafer.

4. The apparatus according to claim 2, wherein said electrostatically charged material is comprised of at least one of amorphous silicon, polypropylene, polethylene, polyester, vinyl chloride, rayon, polytetrafluoroethylene, polyester, or nylon.

5. The apparatus according to claim 4, wherein said electrostatically charged material comprises amorphous silicon.

6. The apparatus according to claim 4, further comprising a charging means connected to said housing.

7. The apparatus according to claim 6, further comprising a dislodging means for removing at least a portion of the particles on the particle removing means.

8. The apparatus according to claim 7, wherein said dislodging means is selected from the group consisting of a physical dislodging means, an electrostatic dislodging means, and a combination of a physical dislodging means and an electrostatic dislodging means.

9. The apparatus according to claim 8, wherein said dislodging means is a combination of a physical dislodging means and an electrostatic dislodging means.

10. The apparatus according to claim 9, wherein said physical dislodging means is a brush or a scraper physically in contact with the particle removing means to effect removal of at least a portion of the particles from the surface of the particle removing means and said electrostatic dislodging means reverses the polarity or substantially decreasing the charge on said electrostatically charged material.

11. The apparatus according to claim 10, wherein said particle removing means carries a charge of sufficient strength to remove particles on the order of about 0.5 microns or smaller.

12. The apparatus according to claim 11, wherein said particle removing means carries a charge of sufficient strength to remove particles on the order of about 0.1 microns or smaller.

13. The apparatus according to claim 1, wherein said particle removing means further comprises a magnetic material disposed within said electrostatically charged material.

14. An apparatus for removing particles from the edges of semiconductor wafers, comprising:
a particle withdrawing means contactable with the edge of at least one semiconductor wafer which removes particles from said wafer;

a particle removing means contactable with said particle withdrawing means which removes said particles from said particle withdrawing means and inhibits the return of said particles to said particle withdrawing means, wherein said particle removing means comprises an electrostatically charged material.

15. The apparatus according to claim 14, which further comprises a housing containing said particle withdrawing means and said particle removing means.

16. The apparatus according to claim 15, wherein said particle withdrawing means employs mechanical, physical, chemical, and/or electrostatic force to remove particles from the edges of the semiconductor wafer(s).

17. The apparatus according to claim 16, wherein said particle withdrawing means comprises polytetrafluoroethylene.

18. The apparatus according to claim 16, wherein said particle withdrawing means is essentially cylindrical in shape and is rotatably contacted with said edge of said wafer.

19. The apparatus according to claim 18, wherein said particle removing means is essentially cylindrical in shape and is rotatably contacted with the edge of said particle withdrawing means.

20. The apparatus according to claim 19, wherein said electrostatically charged material is comprised of at least one of amorphous silicon, polypropylene, polethylene, polyester, vinyl chloride, rayon, polytetrafluoroethylene, polyester, or nylon.

21. The apparatus according to claim 20, wherein said electrostatically charged material comprises amorphous silicon.

22. The apparatus according to claim 21, further comprising a charging means connected to said housing.

23. The apparatus according to claim 22, further comprising a dislodging means for removing at least a portion of the particles on the particle removing means.

24. The apparatus according to claim 23, wherein said dislodging means is selected from the group consisting of a physical dislodging means, an electrostatic dislodging means, and a combination of a physical dislodging means and an electrostatic dislodging means.

25. The apparatus according to claim 24, wherein said dislodging means is a combination of a physical dislodging means and an electrostatic dislodging means.

26. The apparatus according to claim 25, wherein said physical dislodging means is a brush or a scraper physically in contact with the particle removing means to effect removal of at least a portion of the particles from the surface of the particle removing means and said electrostatic dislodging means reverses the polarity or substantially decreasing the charge on said electrostatically charged material.

27. The apparatus according to claim 26, wherein said particle removing means carries a charge of sufficient strength to remove particles on the order of about 0.5 microns or smaller.

28. The apparatus according to claim 27, wherein said particle removing means carries a charge of sufficient strength to remove particles on the order of about 0.1 microns or smaller.

29. The apparatus according to claim 14, wherein said particle removing means further comprises a magnetic material disposed within said electrostatically charged material.

30. A method for removing particles from the edges of semiconductor wafers, comprising:
contacting the edge of at least one semiconductor wafer with a particle removing means to remove particles from said wafer(s) and inhibit the return of said particles to said wafer(s), wherein said particle removing means comprises a non-metallic electrostatically charged material.

31. The method according to claim 30, further comprising the step of contacting said particle removing means with a dislodging means for removing at least a portion of the particles on the particle removing means.

32. The method according to claim 31, wherein said particle removing means is caused to contact said wafer(s) after applying a photoresist material and prior to the photoprocessing of said photoresist material.

33. A method for removing particles from the edges of semiconductor wafers, comprising withdrawing particles from the edge of at least one semiconductor wafer with a particle withdrawing means and contacting said particle withdrawing means with a particle removing means which removes and retains at least a portion of said particles from the particle withdrawing means wherein said particle removing means comprises an electrostatically charged material so as to cause a substantially unidirectional flow of particles away from said wafers.

* * * * *